(12) United States Patent
Shone et al.

(10) Patent No.: US 6,521,495 B2
(45) Date of Patent: Feb. 18, 2003

(54) METHOD OF FABRICATING A NON-VOLATILE MEMORY DEVICE

(75) Inventors: Moon Shone, Suwon (KR); Ji-nam Kim, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 81 days.

(21) Appl. No.: 09/853,637

(22) Filed: May 14, 2001

(65) Prior Publication Data

US 2001/0021561 A1 Sep. 13, 2001

Related U.S. Application Data

(62) Division of application No. 09/323,853, filed on Jun. 2, 1999, now Pat. No. 6,268,622.

(30) Foreign Application Priority Data

Jul. 13, 1998 (KR) .......................................... 98-28164
May 1, 1999 (KR) .......................................... 99-15809

(51) Int. Cl.[7] .......................................... H01L 21/336
(52) U.S. Cl. ..................... 438/257; 438/279; 438/593; 438/594; 438/264
(58) Field of Search ............... 438/264, 257, 438/279, 593, 594, FOR 177, FOR 189, FOR 208, FOR 209, FOR 210, FOR 212, FOR 363

(56) References Cited

U.S. PATENT DOCUMENTS

| | | | |
|---|---|---|---|
| 5,047,362 A | * | 9/1991 | Bergemont |
| 5,371,030 A | * | 12/1994 | Bergemont |
| 5,568,418 A | | 10/1996 | Crizensa et al. ........ 365/185.01 |
| 5,633,185 A | * | 5/1997 | Yiu et al. ................... 438/258 |
| 5,656,837 A | | 8/1997 | Lancaster et al. ........... 257/314 |
| 5,674,768 A | * | 10/1997 | Chang et al. |
| 5,734,607 A | | 3/1998 | Sung et al. ............ 365/185.01 |
| 5,792,695 A | * | 8/1998 | Ono et al. .................... 438/257 |
| 5,834,807 A | | 11/1998 | Kim ............................ 257/315 |
| 5,859,454 A | | 1/1999 | Choi et al. ................... 257/316 |
| 5,925,906 A | | 7/1999 | Tanaka ........................ 257/314 |
| 5,929,479 A | | 7/1999 | Oyama ........................ 257/315 |
| 5,963,824 A | * | 10/1999 | Krivokapic .................. 438/593 |
| 6,034,416 A | | 3/2000 | Uehara et al. ............... 257/623 |
| 6,054,734 A | | 4/2000 | Aozasa et al. ............... 257/314 |
| 6,060,740 A | | 5/2000 | Shimizu et al. ............. 257/314 |
| 6,064,090 A | | 5/2000 | Miyamoto et al. .......... 257/347 |
| 6,103,573 A | * | 8/2000 | Harari et al. ............... 438/257 |
| 6,127,225 A | * | 10/2000 | Liu et al. .................... 438/258 |
| 6,228,718 B1 | * | 5/2001 | Huang et al. ............... 438/266 |
| 6,284,596 B1 | * | 9/2001 | Sung et al. ................. 438/257 |
| 6,355,527 B1 | * | 3/2002 | Lin et al. .................... 438/265 |

FOREIGN PATENT DOCUMENTS

| | | |
|---|---|---|
| JP | 2180079 | 7/1990 |
| JP | 405102437 | 6/1993 |
| JP | 405136428 | 6/1993 |
| KR | 96-26771 | 7/1996 |

\* cited by examiner

*Primary Examiner*—Mary Wilczewski
(74) *Attorney, Agent, or Firm*—Lee & Sterba, P.C.

(57) ABSTRACT

A non-volatile memory device and a fabrication method thereof, wherein the non-volatile memory device includes first and second memory cells in a region of a semiconductor substrate where a word line crosses a bit line. Thus, one word line can control the operation of two memory cells, and the device requires less area. Further an intergate dielectric layer extends to the side walls of the floating gate allowing more area and a higher coupling ratio. A lower voltage may therefore be applied to the control gate. During an erasing operation the path of electrons can be redirected toward the substrate. Deterioration of a tunneling insulating layer is thereby reduced or eliminated.

6 Claims, 12 Drawing Sheets

METHOD OF FABRICATING A NON-VOLATILE MEMORY DEVICE

This application is a, divisional of application Ser. No. 09/323,853, filed Jun. 2, 1999, now U.S. Pat. No. 6,268,622.

BACKGROUND OF THE INVENTION

1. Field of the Invention

The present invention generally relates to a semiconductor device and, more particularly, to a non-volatile memory device and a fabrication method thereof.

2. Description of the Related Art

As non-volatile memory devices have become more highly integrated, the need has increased for reducing the area occupied by a driving circuit for operating a memory cell. There has also been a need for an improvement in an intergate dielectric layer formed between a floating gate and a control gate such that a voltage induced to the floating gate can be maintained at a suitable level for a device's operating characteristics while a low voltage is applied to the control gate. This is so that the level of the voltage of the floating gate, which is induced when a high voltage is applied to the control gate for programming a device, is affected by a coupling ratio of the intergate dielectric layer. Accordingly, improving the coupling ratio of the intergate dielectric layer is needed.

In addition, during the process of erasing a conventional non-volatile memory device, a path of electrons is established toward a source node. That is, due to a small area through which the electrons pass, current density becomes concentrated in the area, thereby deteriorating a tunneling oxide layer, i.e., a tunneling insulating layer. Thus, a new non-volatile memory device capable of preventing deterioration of the tunneling insulating layer and having improved reliability is needed.

The present invention is directed to overcoming or at least reducing the effects of one or more of the problems set forth above.

SUMMARY OF THE INVENTION

Briefly, in accordance with one aspect of the present invention, there is provided a non-volatile memory device comprising a semiconductor substrate, a bit line, a word line which crosses the bit line, a first memory cell in a region of the semiconductor substrate where the word line crosses the bit line, and a second memory cell in a region of the semiconductor substrate where the word line crosses the bit line.

Briefly, in accordance with another aspect of the present invention, there is provided a non-volatile memory device comprising: a plurality of isolation regions formed on a semiconductor substrate to define active regions; a plurality of common source regions formed in the semiconductor substrate, extending in a column direction; a plurality of drain regions formed in the active regions alternately with the common source regions, being separated from the common source regions by a predetermined interval; a tunneling insulating layer formed on the active regions including the common source regions and the drain regions; a plurality of floating gates formed on the tunneling insulating layer, arranged in the column direction along with each common source region, such that each of the common source regions has a pair of the floating gates centered around it; intergate dielectric layers formed on the floating gates; a plurality of control gates formed on the intergate dielectric layers, parallel to the common source regions, each control gate overlapping pairs of floating gates adjacent in the column direction; and a plurality of bit lines formed perpendicular to the plurality of control gates, each bit line being connected to the plurality of drain regions.

Briefly, in accordance with another aspect of the present invention, there is provided a method for fabricating a non-volatile memory device, comprising: forming isolation layers on a semiconductor substrate to define active regions; forming floating gate layers on the active regions while a tunneling insulating layer is interposed therebetween; forming common source regions in a column direction, each crossing the floating gate layers so as to divide each of the floating gate layers and the isolation layers into two parts; forming intergate dielectric layers and control gate layers on the divided floating gate layers; patterning the control gate layers, the intergate dielectric layers and the divided floating gate layers to complete control gates, intergate dielectric layers and floating gates, wherein each control gate is parallel to one of the common source regions and overlaps a pair of the floating gates adjacent in a column direction, and wherein the pair of the floating gates centers around one of the common source regions; and forming bit lines connected to drain regions adjacent to the floating gates.

BRIEF DESCRIPTION OF THE DRAWINGS

The above features and advantages of the present invention will become more apparent upon reference to the following detailed description of specific embodiments and the attached drawings, of which.

DETAILED DESCRIPTION OF THE PREFERRED EMBODIMENT

Figure 1A:
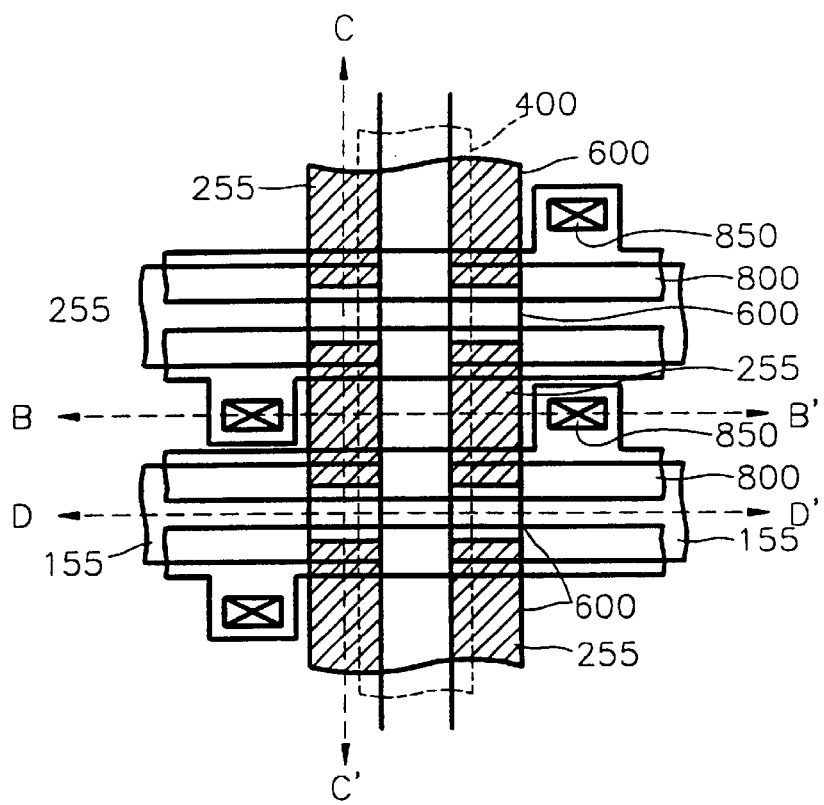
FIG. 1A is a layout showing a part of a non-volatile memory device according to a preferred embodiment of the present invention.

The present invention will now be described in greater detail with reference to the accompanying drawings, in which preferred embodiments of the invention are shown. This invention may, however, be embodied in many different forms, and should not be construed as being limited to the embodiments set forth herein. Rather, these embodiments are provided so that this disclosure will be thorough and complete, and will fully convey the concepts of the invention to those skilled in the art. In the drawings, the thicknesses of layers and regions are exaggerated for clarity. It will also be understood that when a layer is referred to as being "on" or "above" another layer or substrate, it can be directly on the other layer or substrate, or one or more intervening layers may also be present. Similarly, when a layer is referred to as being "under" or "below" another layer or substrate, it can be directly under the other layer or substrate, or one or more intervening layers may also be present.

Referring to FIG. 1A, wherein a non-volatile memory device according to a preferred embodiment of the present invention is shown, reference numeral 155 represents an isolation layer, reference numeral 255 represents a floating gate, reference numeral 400 represents a common source region, reference numeral 600 represents a control gate, and reference numeral 800 represents a bit line. The non-volatile memory device of FIG. 1 comprises first and second memory cells in regions of a semiconductor substrate where the control gate 600 acting as a word line crosses one bit line 800. The configuration of the non-volatile memory device according to the present invention will be described in detail with reference to FIGS. 1B through 1D.

Figure 1B:
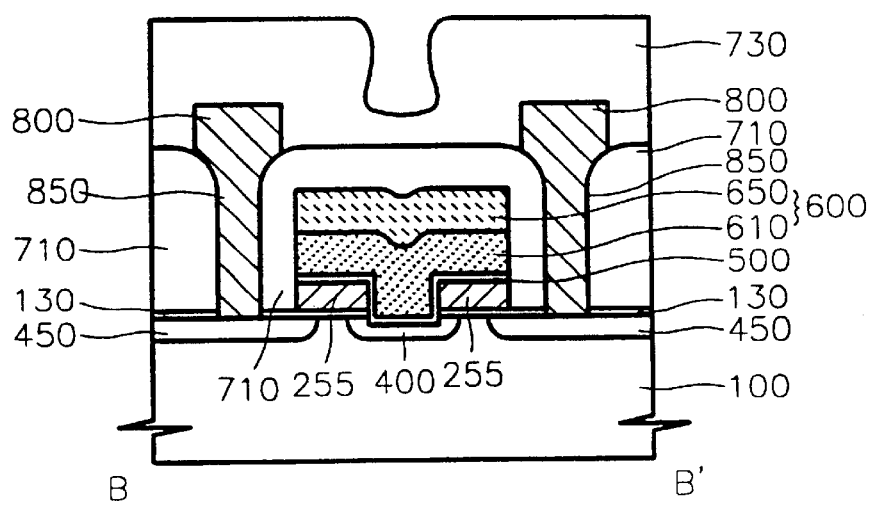
FIG. 1B is a section view cut along line B–B' of FIG. 1A.
Figure 1C:
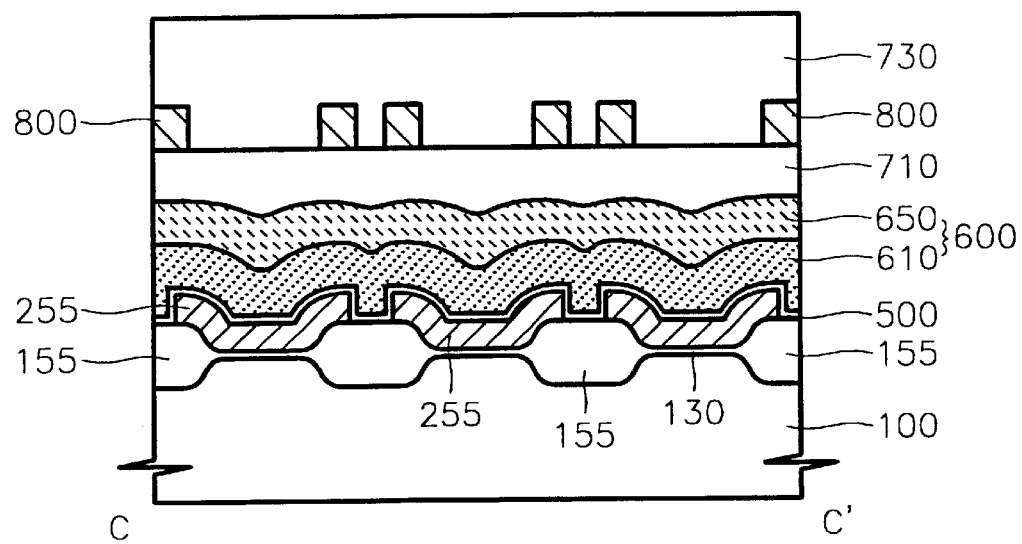
FIG. 1C is a section view cut along line C–C' of FIG. 1A.
Figure 1D:
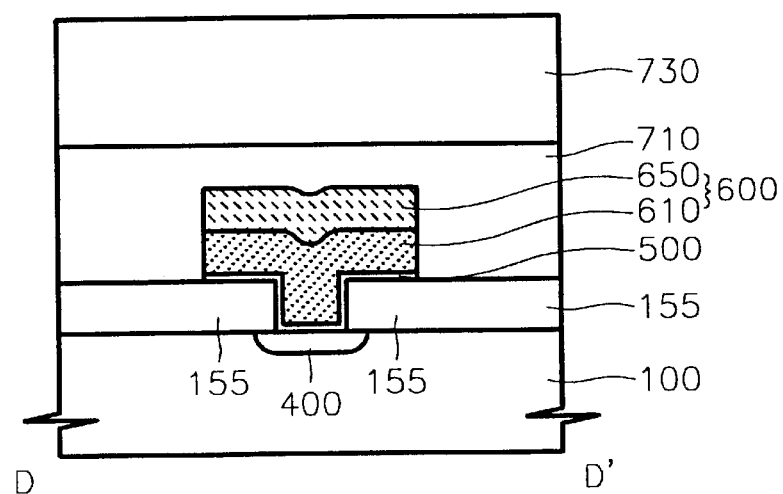
FIG. 1D is a section view cut along line D–D' of FIG. 1A.
Figure 2A:
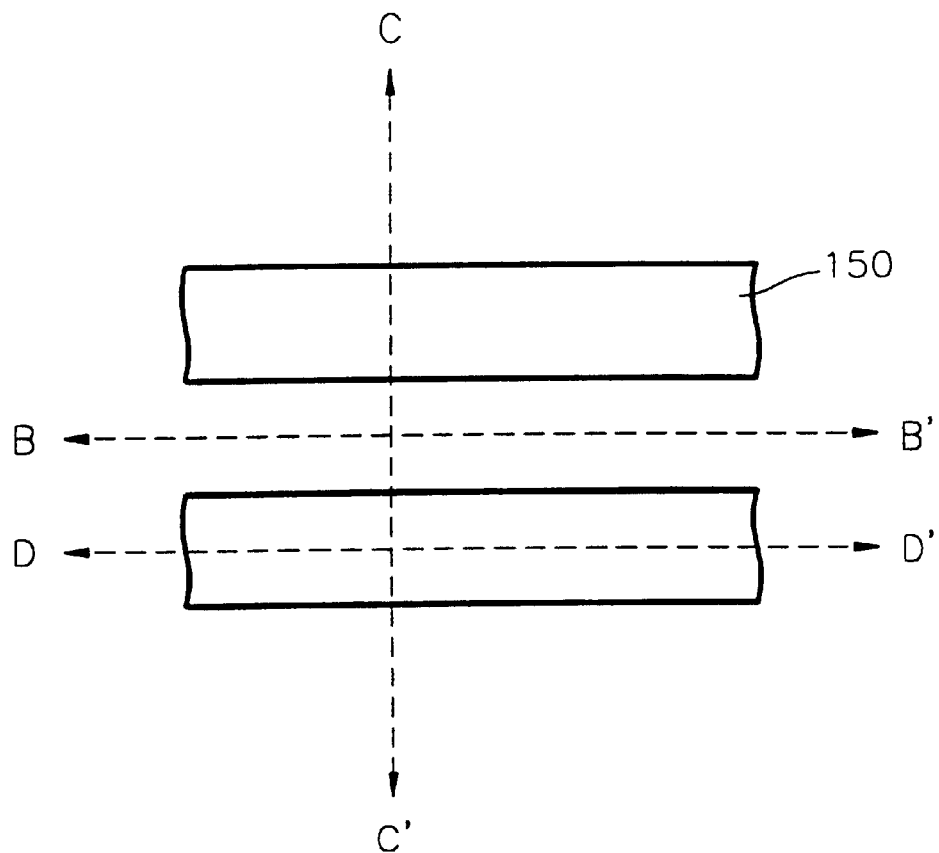
FIGS. 2A, 3A, 4A, 5A and 6A are top views of a part of a non-volatile memory device, for illustrating a method for fabricating the memory device according to a preferred embodiment of the present invention.
Figure 2B:
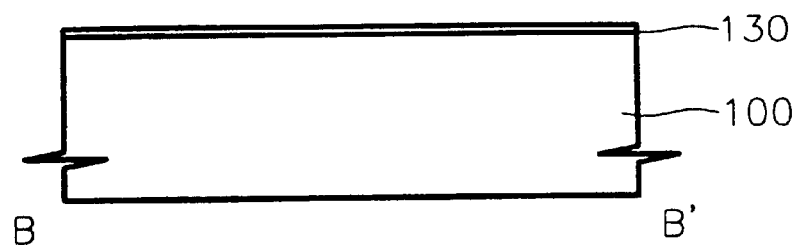
FIGS. 2B, 3B, 4B, 5B and 6B are section views each cut along lines B–B' of FIGS. 2A, 3A, 4A, 5A and 6A, respectively.
Figure 2C:
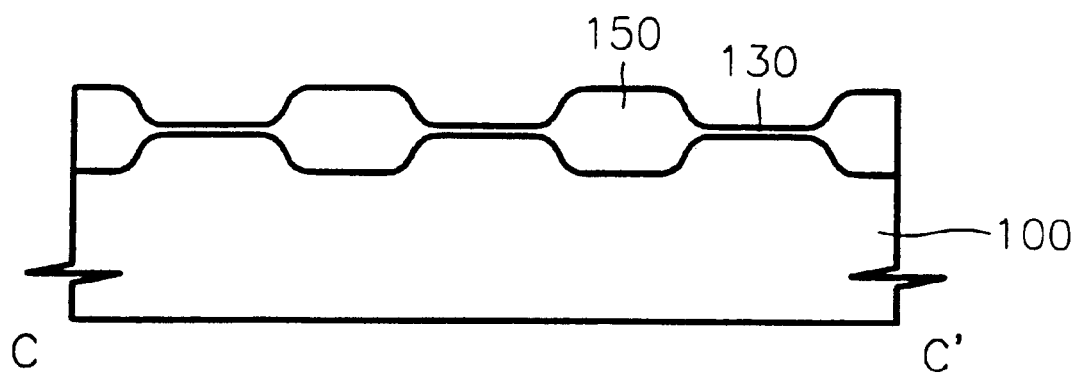
FIGS. 2C, 3C, 4C, 5C and 6C are section views each cut along lines C–C' of FIGS. 2A 3A, 4A, 5A and 6A, respectively.
Figure 2D:
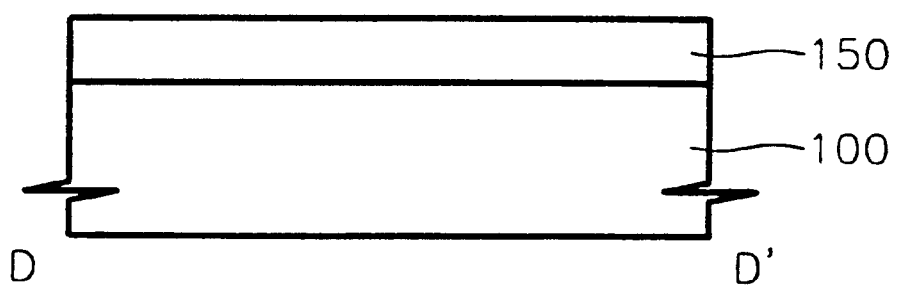
FIGS. 2D, 3D, 4D, 5D and 6D are section views each cut along lines D–D' of FIGS. 2A, 3A, 4A, 5A and 6A, respectively.

Referring to FIGS. 1B through 1D, the non-volatile memory device of the present invention comprises a common source region 400 in an active region defined by an isolation layer 155 of a semiconductor substrate 100. Also, the active region of the semiconductor substrate 100 includes a tunneling insulating layer 130 made of an oxide. The tunneling insulating layer 130 is on the substrate 100.

As shown in FIG. 1A, a plurality of floating gates 255 are arranged in columns along with the common source region 400. As shown in FIG. 1B, a pair of the floating gates 255 center around the common source region 400. That is, a pair of floating gates. 255 shares the common source region 400.

Also, the control gate 600 simultaneously overlaps the facing pair of floating gates 255. That is, the control gate 600 covers two floating gates 255 at the same time. Also, the control gate 600 overlaps the common source region 400 between the facing pair of floating gates 255.

Accordingly, one control gate 600, i.e., word line, can control simultaneously an electron charge level of one pair of floating gates 255, in contrast to a conventional non-volatile memory device in which one control gate controls an electron charge level of one floating gate. Thus, in the present invention, one address decoder can select simultaneously two floating gates 255 in contrast to a conventional non-volatile memory device in which one address decoder selects one floating gate. The area occupied by peripheral circuits including address decoder circuits can be reduced because the number of address decoders is reduced by ½.

The control gate 600 includes an impurity-doped polysilicon layer pattern 610 and a tungsten silicide layer pattern 650.

An intergate dielectric layer 500 is formed on the interface between the control gate 600 and the floating gate 255. For example, the intergate dielectric layer 500 is formed as a triple layer of oxide/nitride/oxide (ONO). The intergate dielectric layer 500 extends to the interface between the control gate 600 and the common source region 400, to insulate the control gate 600 from the common source region 400.

The intergate dielectric layer 500 covers the top of the floating gate 255 and at the same time extends on the side walls of the floating gate 255. As a result, a voltage ratio, i.e., a coupling ratio, induced to the floating gate 255 by the voltage applied to the control gate 600 increases. Thus, the level of voltage induced to the floating gate 255 can be increased while a low voltage is applied to the control gate 600.

Other active regions proximate to the floating gates 255 include drain regions 450. The drain region 450 electrically connects the bit line 800. The bit line 800 is formed on the contact junction region through a contact hole 850, such that the bit line 800 and the drain region 450 are electrically connected.

A transistor according to the present invention having the above structure can be operated by the following example method. When a voltage of approximately 10V is applied to the control gate 600 after a voltage of approximately 5V is applied to one bit line 800, hot electrons are generated toward the drain region 450 from a channel pinch-off region (not shown) of the transistor. The generated hot electrons are injected into the floating gate 255 for programming. The semiconductor substrate 100 and the common source region 400 are grounded.

When a voltage of approximately 5V is applied simultaneously to both bit lines 800 as shown in FIG. 1B and then a voltage of approximately 10V is applied to the control gate 600, the hot electrons can be injected simultaneously into two floating gates 255. That is, the programming can operate in two or more floating gates 255 by the control of one control gate 600.

Alternatively, when a voltage of approximately 5V is applied to selected one of two bit lines 800 as shown in FIG. 1B, a voltage of approximately 0V or ground is applied to unselected another bit line and then a voltage of approximately 10V is applied to control gate 600, the hot electrons can be injected into only the floating gate adjacent to the selected bit line. Accordingly, one of two floating gates 255 formed below one control gate 600 can be selectively programmed. In addition, when a voltage of approximately 5V is applied to a selected bit line 800, a voltage of approximately 0V is applied to unselected bit line 800, and a voltage of approximately 5V is applied to the control gate, a read operation for determining whether to be programmed or not based on the amount of current flowing along a channel, which depends on whether the electrons are injected into the floating gate 255, can be performed.

When both bit lines 800 are in a floating state while the control gate 600 is grounded, and a voltage of approximately 12V is applied to the semiconductor substrate 100, electrons can be erased through the entire channel from the floating gate 255. An erasing operation for erasing electrons from the floating gate 255 can be performed by applying a voltage of approximately 12V to the common source region 400.

During such an erasing operation, a path through which the electrons pass is redirected toward the semiconductor substrate 100, so that the current density of the erased electrons from the floating gate 255 can be spread out or dispersed. Thus, the problem of deterioration of the tunneling insulating layer 130, caused by the concentration of electrons (increased current density), can be solved, thereby improving the reliability of the transistor.

Hereinbelow, referring to FIGS. 2A through 6D, a fabrication method for the preferred non-volatile memory device according to the present invention will be described.

Referring to FIGS. 2A, 2B, 2C and 2D, a plurality of isolation layers 150 which define active regions are formed on the semiconductor substrate 100, e.g., a P-type substrate in a matrix shape. For example, the isolation layer 150 is formed in an elongated shape in a row direction, e.g., along the bit line 800 (see FIG. 1), by a local oxidation of silicon (LOCOS) or poly-buffered locos (PBL) method. Then oxide layers covering the active regions of the semiconductor substrate 100 defined by the isolation layers 150 are formed to be used as a tunneling insulating layer 130.

Referring to FIGS. 3A, 3B, 3C and 3D, a conductive layer, e.g., a polysilicon layer, covering the tunneling insulating layers 130 and the isolation layers 150, is formed to a thickness of approximately 1000 angstroms.

The polysilicon layer may be formed while impurities are not doped yet. In this case, the polysilicon layer can be doped with impurities by the following process of implanting impurities into the polysilicon layer, or diffusing impurities into the polysilicon layer by coating a $POCl_3$ layer on the polysilicon layer and then heating it.

Figure 3A:
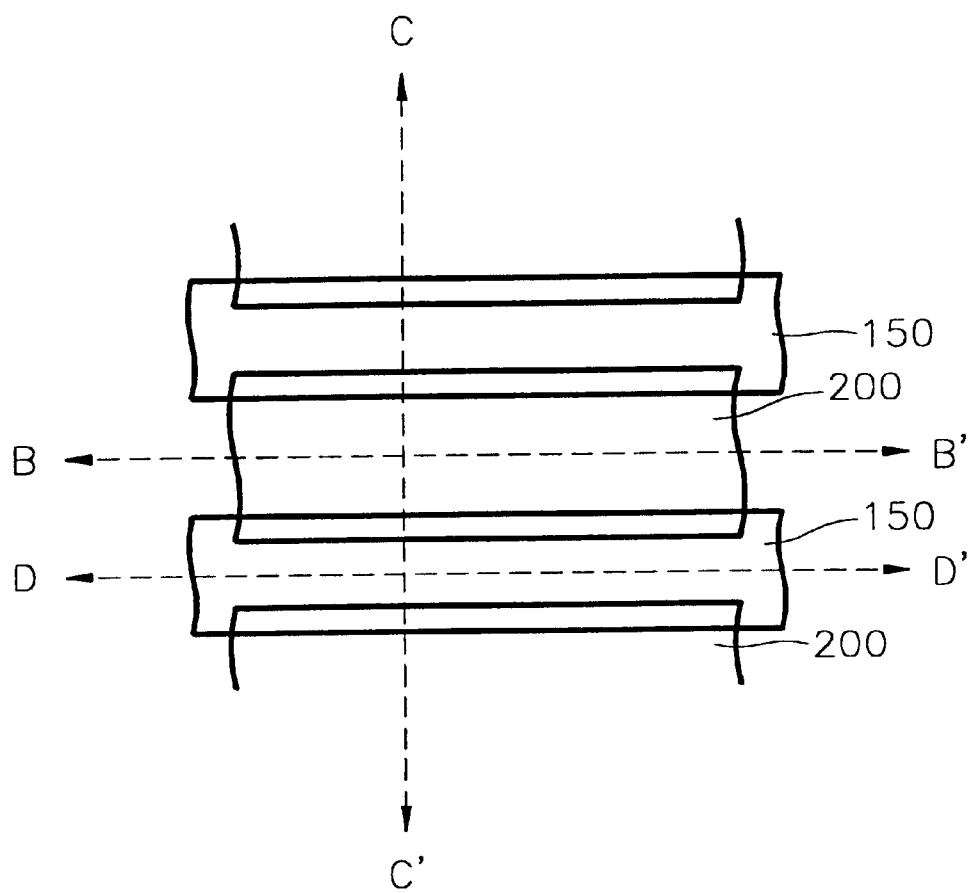
Figure 3B:
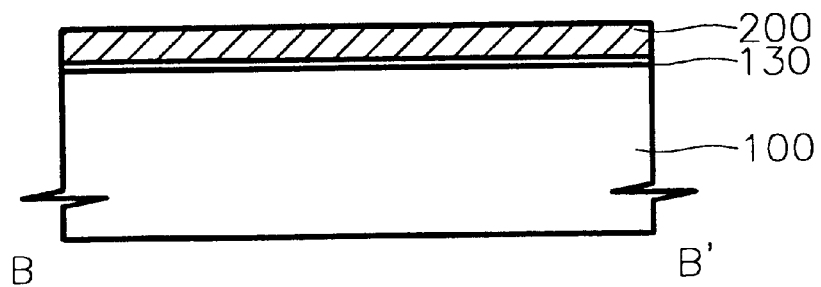
Figure 3C:
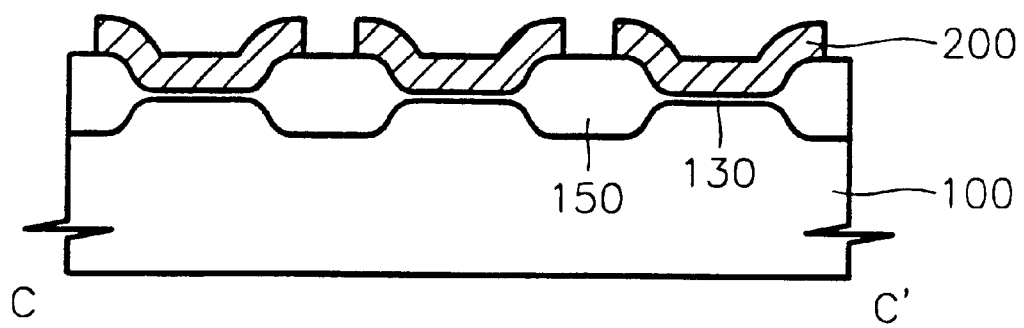
Figure 3D:
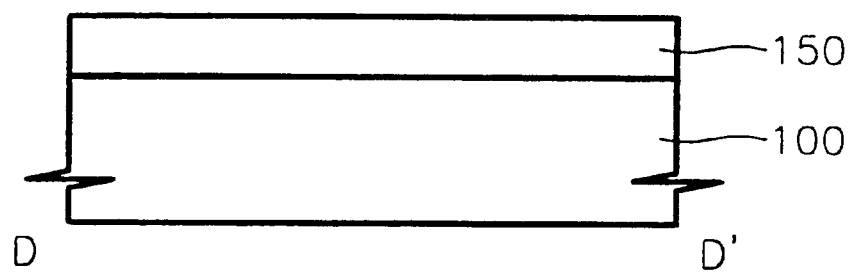
Figure 4A:
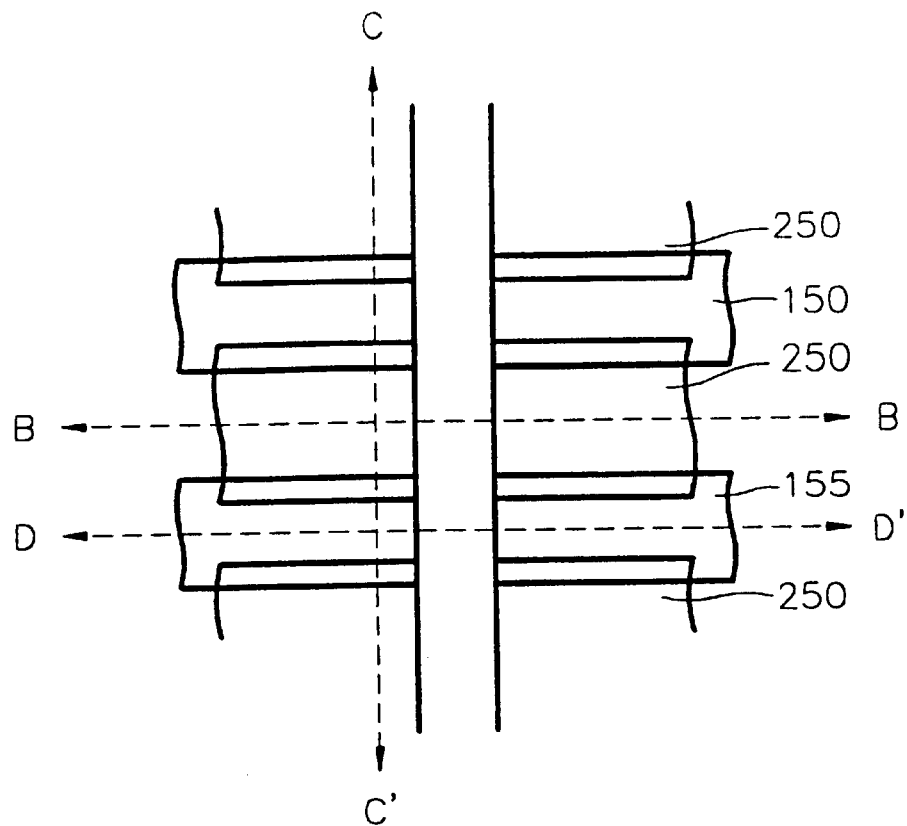
Figure 4B:
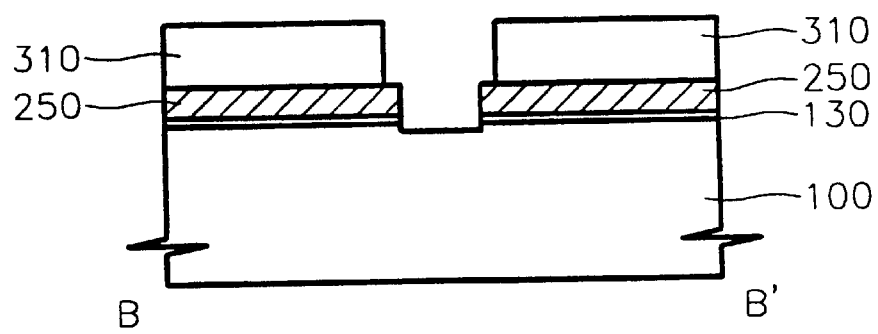
Figure 4C:
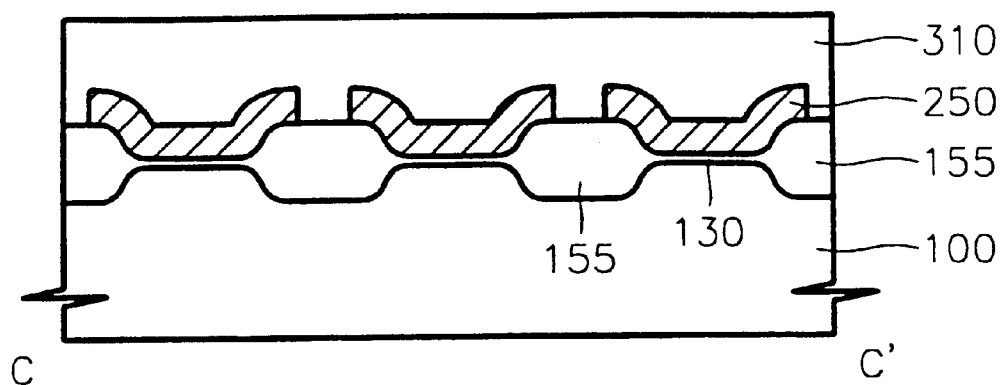
Figure 4D:
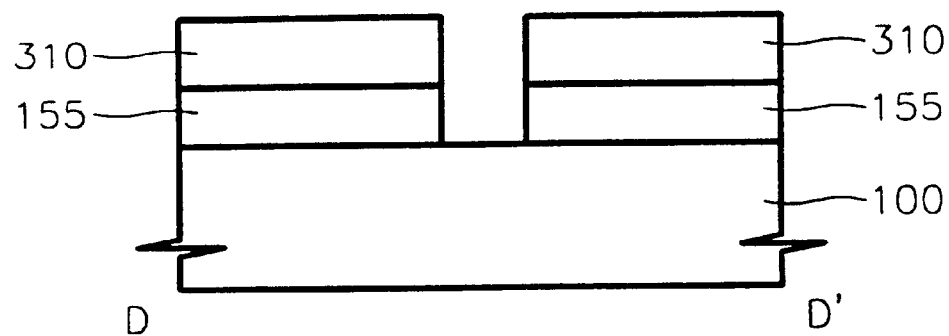
Figure 5A:
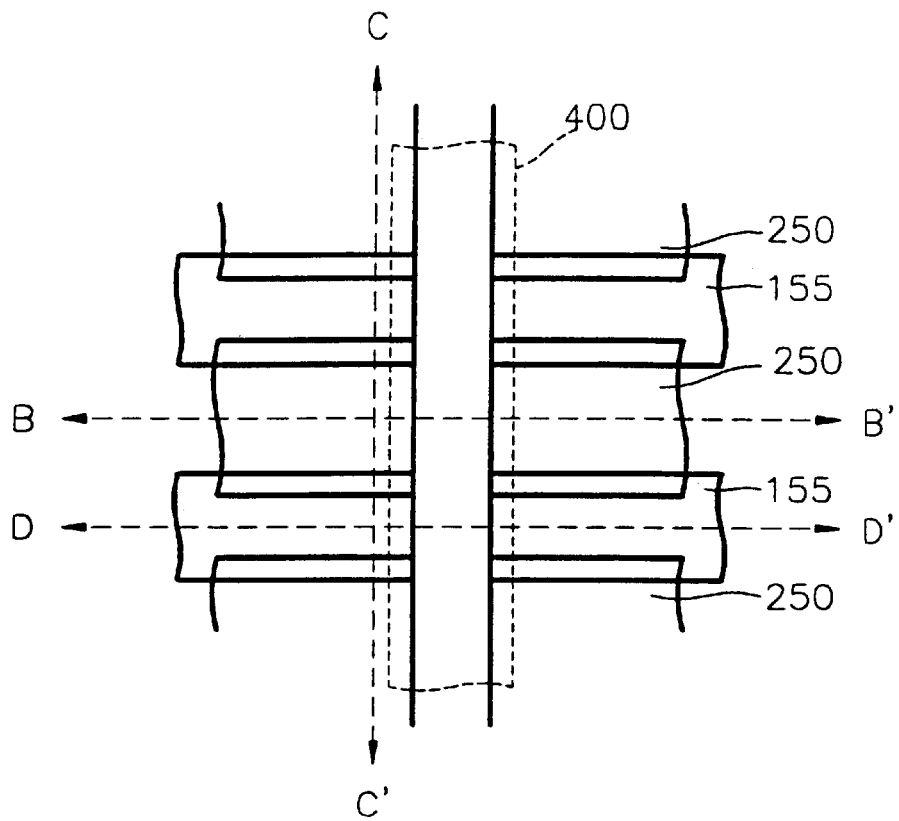
Figure 5B:
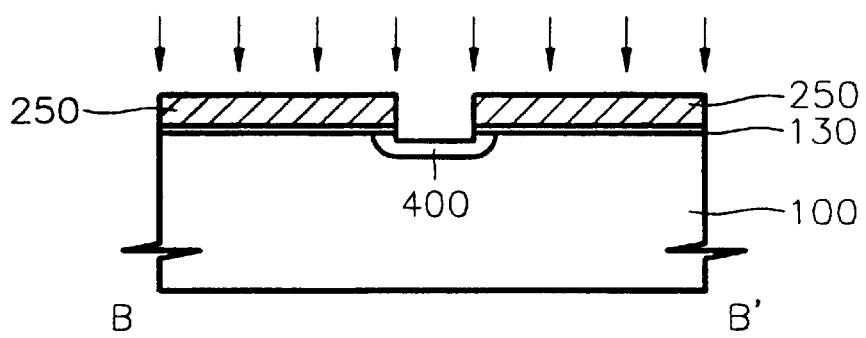
Figure 5C:
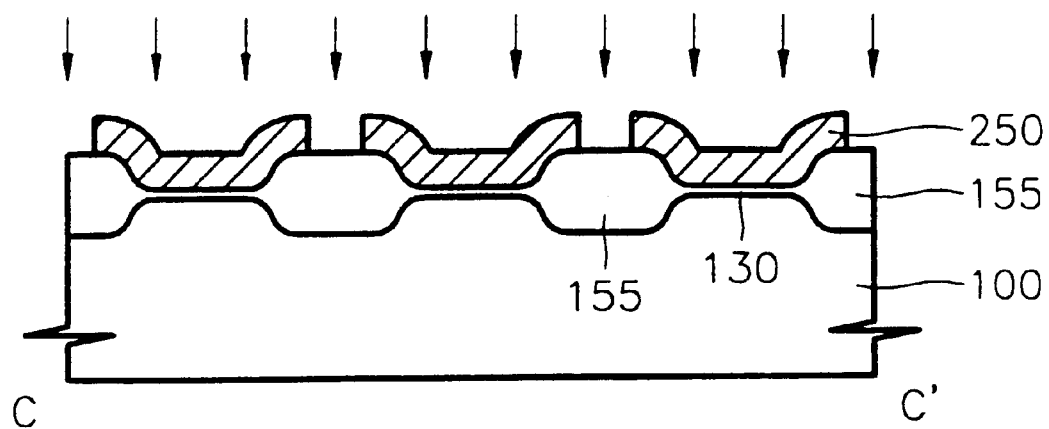
Figure 5D:
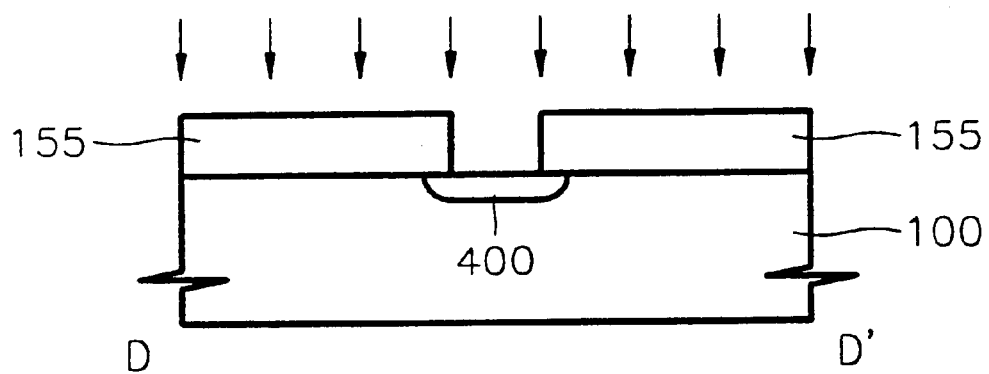
Figure 6A:
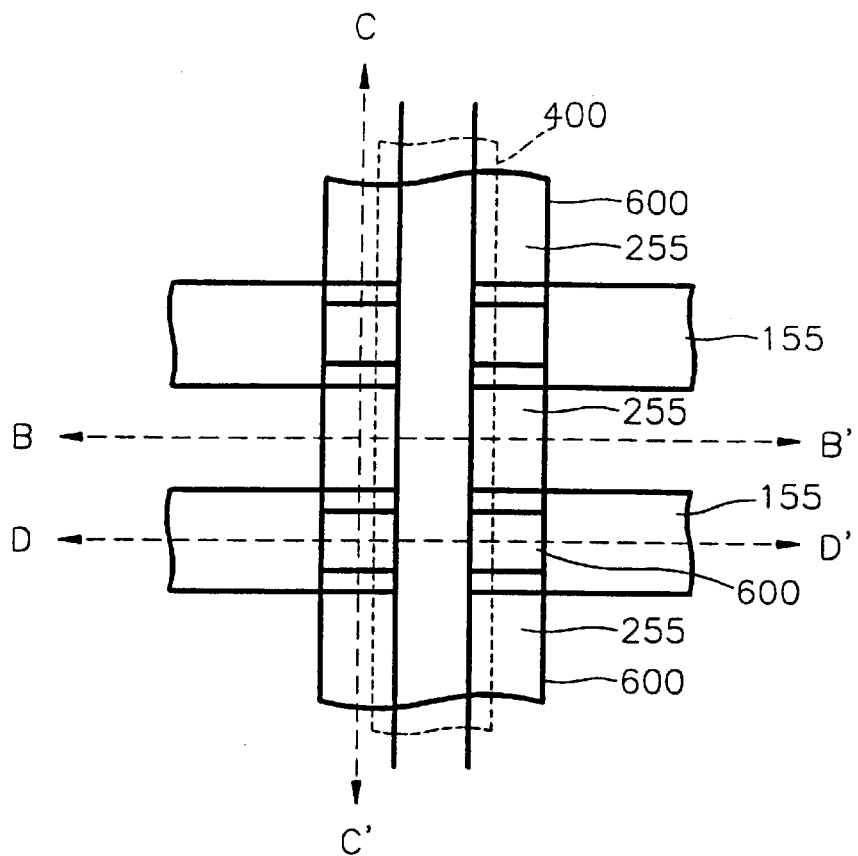
Figure 6B:
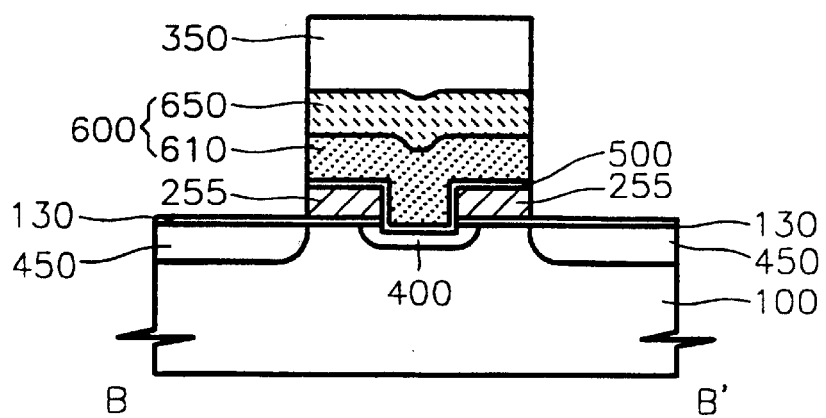
Figure 6C:
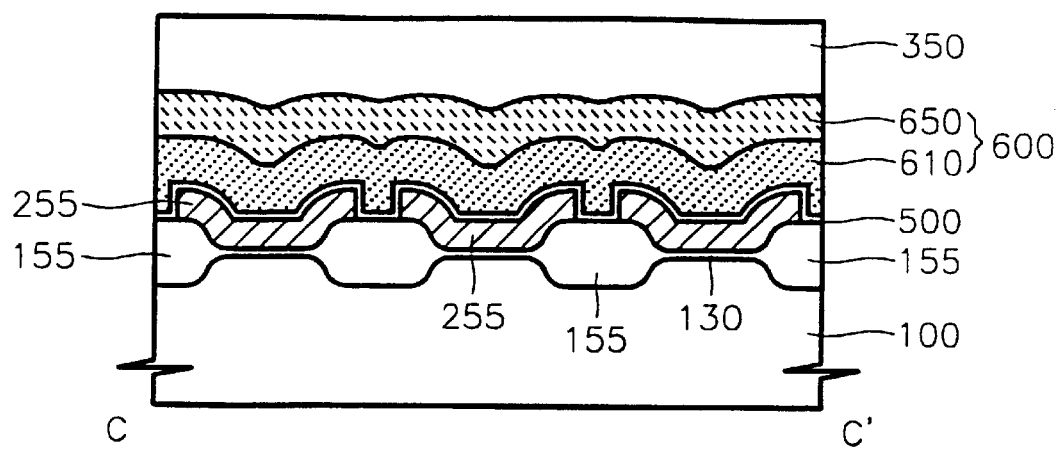
Figure 6D:
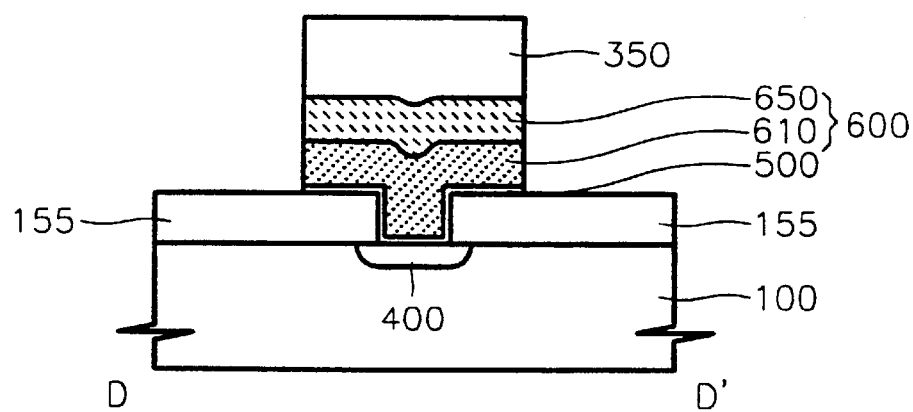

The formed conductive layer is patterned through photolithography, resulting in floating gate layers 200. The conductive layer may be patterned in an elongated shape in a row direction, e.g., along the longitudinal direction of the isolation layer 150. That is, the conductive layer may be patterned along the bit line 800 (see FIG. 1A). The conductive layer is patterned to partially overlap the isolation layer 150 as shown in FIG. 3C.

Referring to FIGS. 4A, 4B, 4C and 4D, the isolation layers 150 and the floating gate layers 200 are patterned, to complete floating gate layers 250 individually separated to expose the semiconductor substrate 100. In detail, a first photoresist pattern 310 which exposes the isolation layer 150 or the floating gate layer 200 in a column direction is formed. For example, the first photoresist pattern 310 partially exposing the isolation layer 150 and the floating gate layer 200, e.g., the center of the floating gate layer 200, which crosses the isolation layer 150 and the floating gate layer 200, is formed through exposure and development processes.

Next, a part of the isolation layer 150, and the exposed floating gate layer 200 and tunneling insulating layer 130 are etched using the first photoresist pattern 310 as an etch mask, to expose the semiconductor substrate 100 beneath the layers. As a result, each of the isolation layers 150 and the floating gate layers 200 is divided into two parts by the exposed region of the semiconductor substrate 100, resulting in a divided isolation layer 155 and a divided floating gate layer 250.

Referring to FIGS. 5A, 5B, 5C and 5D, the first photoresist pattern 310 is removed. Then impurities are implanted into the semiconductor substrate 100 exposed by the divided isolation layer 155 and the divided floating gate layer 250 to form common source regions 400. The impurities can be implanted simultaneously into the floating gate layer 250 and into the exposed semiconductor substrate 100.

In other words, the impurities are implanted into the polysilicon layer which constitutes the divided floating layer 250 by ion implantation, to provide conductivity to the divided floating layer 250. Simultaneously, impurities are implanted into the exposed semiconductor substrate 100 by ion implantation, to form the common source regions 400.

The n-type impurities are implanted such that a deep junction is formed in the common source region 400. For example, a $n^{31}/n^+$ impurity layer structure is formed through continuous symmetrical ion implantation. That is, the ion implantation is performed such that the common source regions 400 have a double diffused (DD) structure.

Referring to FIGS. 6A, 6B, 6C and 6D, an intergate dielectric layer 500 covering the divided floating gate layer 250 is formed, e.g., as a triple layer of oxide/nitride/oxide. Then a conductive layer as a control gate layer is formed on the intergate dielectric layer 500. For example, a polysilicon layer is formed to a thickness of approximately 1000 angstroms. A tungsten layer is formed on the polysilicon layer and then thermally treated to form a tungsten silicide ($WSi_x$) layer to a thickness of approximately 1,000 angstroms. Then the polysilicon layer and the tungsten silicide layer are patterned using etching mask 350 to form a control gate 600 consisting of a polysilicon layer pattern 610 and a tungsten silicide layer pattern 650.

The patterning continues after the control gate 600 is formed. That is, the intergate dielectric layer 500 and the divided floating gate layer 250, which are under the control gate 600, are etched through self-aligning etching. This results in a cell transistor having a structure in which at least two floating gates 255 exist below one control gate 600.

The intergate dielectric layer 500 insulates the common source region 400 from the control gate 600. The intergate dielectric layer 500 extends to cover the side walls of the floating gates 255.

After forming control gate 600 and floating gates 255, a drain region 450 is formed on the semiconductor substrate 100 adjacent to the floating gates 255. The drain region 450 is formed by implanting n-type impurities into the semiconductor substrate 100 using the etching mask 350 and the control gate 600 as an implanting mask. The drain region 450 may be formed of a lightly doped drain (LDD) structure. That is, after n-impurities are implanted into the semiconductor substrate 100 adjacent to the floating gates 255, subsequently spacers can be formed on sidewalls of the control gate 600 and the two floating gates 255. Then, $n^+$-impurities are implanted into the semiconductor substrate 100 using the spacers as an implanting mask to provide the drain of the LDD structure. Then a first dielectric layer 710 covering the resultant structure having the control gate 600 is formed as shown in FIGS. 1A, 1B, 1C and 1D. Then contact holes 850 exposing the drain regions 450 adjacent to the floating gate 255 are formed.

A metal layer connected to drain region 450 is formed and then patterned, to be used as the bit line 800. Then a second dielectric layer 730 for insulating the bit line 800 is formed.

In the non-volatile memory device and the fabricating method thereof according to the present invention, one control gate controls the electron injection and erasing operations in at least two floating gates. Accordingly, the area occupied by a peripheral circuit including an address decoder circuit can be reduced, because of being able to reduce the number of the address decoders by one address decoder selecting two floating gates.

Also, the path of electrons for the erasing operation can be redirected toward the semiconductor substrate, thereby preventing concentration of electrons (high current density). Accordingly, deterioration of the tunneling oxide layer can be prevented, and thereby improve the reliability of the non-volatile memory device.

In addition, the intergate dielectric layer extends to the side walls of the floating gate, so that the area of the intergate dielectric layer becomes large. The coupling ratio in the intergate dielectric layer, which determines the level of voltage induced to the floating gate by the voltage applied to the control gate, is proportional to the thickness or area of the intergate dielectric layer. Thus, because of the increase in area of the intergate dielectric layer, the coupling ratio also increases. This maintains the voltage induced to the floating gate at an appropriate level while the level of voltage applied to the control gate is reduced or allowed to be maintained at a low level.

Thus, a non-volatile memory device and a fabrication method thereof have been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for fabricating a non-volatile memory device, comprising:

forming isolation layers on a semiconductor substrate to define active regions;

forming floating gate layers on the active regions while a tunneling insulating layer is interposed therebetween;

forming common source regions in a column direction, each crossing the floating gate layers so as to divide each of the floating gate layers and the isolation layers into two parts;

forming intergate dielectric layers and control gate layers on the divided floating gate layers;

patterning the control gate layers, the intergate dielectric layers and the divided floating gate layers to complete control gates, intergate dielectric layers and floating gates, wherein each control gate is parallel to one of the common source regions and overlaps a pair of the floating gates adjacent in a column direction, and wherein the pair of the floating gates centers around one of the common source regions; and forming bit lines connected to drain regions adjacent to the floating gates.

2. The method for fabricating a non-volatile memory device according to claim 1, wherein the floating gate layers are formed in elongated shapes in a row parallel to the longitudinal direction of the isolation layers to expose the isolation layers and a part of the active regions defined by the isolation layers.

3. The method for fabricating a non-volatile memory device according to claim 1, wherein the forming of common source regions further comprises:

forming photoresist patterns which expose a part of the floating gate layers and a part of the isolation layers, and which cross the isolation layers in the column direction perpendicular to the longitudinal direction of the isolation layers;

removing the exposed part of the floating gate layers and the exposed part of the isolation layers using the photoresist patterns as an etching mask, thereby exposing a part of the semiconductor substrate and resulting in divided floating layers and divided isolation layers; and implanting impurities into the exposed semiconductor substrate.

4. The method for fabricating a non-volatile memory device according to claim 3, wherein the implanting of impurities into the exposed semiconductor substrate further comprises:

removing the photoresist patterns; and simultaneously implanting the impurities into the exposed semiconductor substrate and into the divided floating gate layers.

5. The method for fabricating a non-volatile memory device according to claim 1, wherein the intergate dielectric layers cover side walls of the divided floating gates.

6. The method for fabricating a non-volatile memory device according to claim 5, wherein the intergate dielectric layers insulate the control gates from the common source regions.

* * * * *